United States Patent [19]

Moon

[11] Patent Number: 5,744,374
[45] Date of Patent: Apr. 28, 1998

[54] DEVICE AND MANUFACTURING METHOD FOR A FERROELECTRIC MEMORY

[75] Inventor: Jong Moon, Suwon, Rep. of Korea

[73] Assignee: Samsung Electronics Co., Ltd., Suwon, Rep. of Korea

[21] Appl. No.: 751,389

[22] Filed: Nov. 18, 1996

Related U.S. Application Data

[62] Division of Ser. No. 620,209, Mar. 22, 1996, Pat. No. 5,621,681.

[30] Foreign Application Priority Data

Mar. 22, 1995 [KR] Rep. of Korea .................. 95-6108

[51] Int. Cl.$^6$ ................ H01L 21/70; H01L 27/00
[52] U.S. Cl. ................ 437/60; 437/919; 437/42; 437/52
[58] Field of Search ................ 437/52, 60, 919, 437/47, 42

[56] References Cited

U.S. PATENT DOCUMENTS 5,053,917  10/1991  Miyasaka et al. .................. 361/321
5,185,689  2/1993  Maniar .................. 361/313
5,187,638  2/1993  Sandhu et al. .................. 361/313

*Primary Examiner*—Jey Tsai
*Attorney, Agent, or Firm*—Samsung Electronics Co., Ltd.

[57] ABSTRACT

A ferroelectric memory device of an MFIS FET structuring using a yttrium oxide film as a buffer film and a manufacturing method of the memory device are provided. The MFIS FET includes a p-type silicon substrate, a field oxide film formed in a device isolation region of the silicon substrate, a gate yttrium oxide film formed on the surface of the silicon substrate, a gate ferroelectric film formed on the gate yttrium oxide film, a gate TiN electrode formed on the gate ferroelectric film, and an n-type source/drain region formed in the silicon substrate of both sides of the gate TiN electrode. In this way, single crystals of the gate yttrium oxide film are easily formed resulting in the formation of a good-quality ferroelectric film on the yttrium oxide film.

5 Claims, 4 Drawing Sheets

DEVICE AND MANUFACTURING METHOD FOR A FERROELECTRIC MEMORY

This is a divisional of application Ser. No. 08/620,209, filed Mar. 22, 1996, U.S. Pat. No. 5,621,681.

BACKGROUND OF THE INVENTION

The present invention relates to a semiconductor memory device and a manufacturing method thereof. More particularly, the present invention relates to a ferroelectric memory device in which a ferroelectric film is used for a gate insulating film and a manufacturing method thereof.

Recent advances in thin-film technology have produced nonvolatile memory devices using ferroelectric films (i.e., ferroelectric memory devices), which can perform high-speed read/write operations by using the polarization reversal and retention characteristics of the ferroelectric film. Since the polarization reversal of a ferroelectric film is caused by a transition at the atomic level, a ferroelectric memory device operates $10^4$–$10^5$ times faster than other types of nonvolatile memories (e.g., EEPROM or flash memory devices) and thus can achieve read-cycle speeds comparable to that of a DRAM device, i.e., in the hundreds of nanoseconds. Also, since polarization reversal only requires a low supply voltage, e.g., two to five volts, the memory device does not require the higher supply voltage, e.g., ten to twelve volts, necessary for EEPROM or flash memory read operations.

Broadly speaking, there are two types of conventional ferroelectric memory devices: one which detects the amount of charge stored in a capacitor and one which detects a change in the resistance caused by the spontaneous polarization of a ferroelectric.

The first type comprises two transistors and two capacitors or of a single transistor-capacitor pair. Memory devices of this type are widely adopted in DRAM devices and are generally formed of CMOS transistors, with a thick interlayer insulating film separating the transistors from a ferroelectric capacitor formed on top. In this structure, although the impact of the ferroelectric electrode material on the underlying CMOS device can be reduced, a destructive read-out problem persists in that the stored data is ultimately destroyed by being read. This destructive read-out becomes of greater concern as lumber of read/write operations in a memory device increases.

The second type of ferroelectric memory device endeavors to overcome this destructive read-out problem. An example of the second type of ferroelectric memory device is called a metal-ferroelectric insulator semiconductor field-effect transistor (MFIS FET). Such a device provides for nondestructive read-out, which makes it appropriate for increased read/write operations. In principle, this type of memory device, which has a single transistor compared to a DRAM having both a transistor and a capacitor, reduces the cell area without altering the cell structure in accordance with typical MOS FET scaling rules. Moreover, its read time need not be as long as that of a flash memory which is a nonvolatile memory, and data can be retained after a read-out operation. The memory device employs a metal-insulator-semiconductor (MIS) structure using a ferroelectric film as a gate insulating film, in which a read-out operation is performed by forming an inversion layer in a channel region of a transistor. The inversion layer is formed by controlling the potential on a silicon interface based on the polarization retention of a ferroelectric.

However, there are additional problems encountered with the use of the MFIS FET. The major problem derives from the fact that in the MFIS FET a ferroelectric film is formed directly on a silicon semiconductor substrate. When an oxide ferroelectric film, such as PZT ($PbZr_xTi_{1-x}O_3$), is formed directly on a silicon substrate, oxygen atoms are injected from the oxygen-rich ferroelectric film into its interface with the silicon substrate, thereby resulting in the formation of a superfluous thin film, e.g., an $SiO_2$ film. As a result, either the composition ratio of the ferroelectric film is locally destroyed, or a higher operating voltage is required. Furthermore, charged particles are injected into the film by trap levels resulting from stress of the ferroelectric film, thereby erasing the charge produced by polarization retention. Also, if the film is formed at a high temperature, constituents of the ferroelectric are apt to diffuse into the silicon substrate and alter the characteristics of the field effect transistor. In addition, if a non-oxide ferroelectric, e.g., $BaMgF_4$, were used instead of an oxide ferroelectric, fluorine ions are apt to penetrate into the gate insulating film, resulting in the elimination of the polarization characteristics.

Accordingly, since a ferroelectric film is not compatible with a silicon substrate in terms of lattice constant and thermal expansion coefficient, it is very difficult to form a high-quality ferroelectric film on the silicon substrate. Furthermore, to form the source/drain regions by self-alignment, a film showing tolerance to a thermal process at approximately 1,000° C. would be required.

In an effort to solve the above problems, an MFIS FET in which a $PbTiO_3$ film is deposited on a $CeO_2$ film and aluminum is used for the electrodes has recently been reported. FIG. 1 is a sectional view showing a conventional MFIS FET using a $CeO_2$ film.

Referring to FIG. 1, the MFIS FET includes a p-type silicon substrate 1, a field oxide film 2, a source/drain region 3, a $CeO_2$ film 5, a $PbTiO_3$ ferroelectric film 6, and an aluminum gate electrode 7. In this device, the hetero-epitaxial growth of $PbTiO_3$ ferroelectric film 6 is realized by using the $CeO_2$ film 5 as a gate insulating film. Since the forming of the gate electrode in this structure occurs after high-temperature process of forming the ferroelectric film, aluminum can be used as the electrode material and the structure becomes suitable for integration. Thus, the MFIS FET can be applied to a memory device.

However, although the $CeO_2$ film 5 shown in FIG. 1 exhibits little lattice mismatching (approximately 0.35%) with a (111) substrate, it has no great advantage with respect to a (100) substrate. Furthermore, the electrical characteristics of this MVIS FET have not been completely verified.

SUMMARY OF THE INVENTION

It is an object of the present invention to provide a ferroelectric memory device having an insulating film which is matched well with silicon in terms of lattice constant and thermal expansion coefficient.

It is another object of the present invention to provide a method for manufacturing the above ferroelectric memory device.

To achieve the above objects, there is provided a ferroelectric memory device comprising a semiconductor substrate of a first conductive type; a yttrium oxide ($Y_2O_3$) gate film formed over the semiconductor substrate; a ferroelectric gate film formed over the yttrium oxide film; a gate electrode formed over the ferroelectric film; and a source/drain region of a second conductive type different from the first conductive type, formed in said semiconductor substrate along sides of the gate electrode.

Preferably, the gate ferroelectric film comprises one of PZT, PT, or Y1 family materials, and the gate electrode comprises either a TiN film or a double-layered film having a TiN film and tungsten.

To further achieve the above objects, there is also provided a ferroelectric memory device comprising: a semiconductor substrate of a first conductivity type; a gate comprising a yttrium oxide gate film formed over the semiconductor substrate; a ferroelectric gate film formed over the yttrium oxide film; and a gate electrode formed over the gate ferroelectric film; a spacer formed over the gate and covering sidewalls of the gate; a first-concentration impurity region of a second conductive type different from the first conductive type, formed below the spacer; and a second-concentration source/drain region of the second conductive formed in the semiconductor substrate along sides of the gate and connected to the first-concentration impurity region, wherein a second concentration of the second-concentration source/drain region being higher than a first concentration of the first-concentration impurity region.

Preferably, the gate ferroelectric film comprises one of PZT, PT, and Y1 family materials, and the gate electrode comprises either a TiN film or a double-layered film having a TiN film and tungsten. In addition, the spacer preferably comprises one of $SiO_2$, $Si_3N_4$, SiON, and $Y_2O_3$.

To achieve the other objects listed above, there is provided a method for manufacturing a ferroelectric memory device, the method comprising the steps of: forming a device isolation region in a predetermined area of a semiconductor substrate of a first conductive type; sequentially depositing a yttrium oxide film, a ferroelectric film, and a conductive film over the surface of the semiconductor substrate; forming a mask pattern over the yttrium oxide film, ferroelectric film, and gate conductive film; forming a gate electrode, a ferroelectric gate film and a yttrium oxide gate film by etching the conductive film, the ferroelectric film and the yttrium oxide film, using the mask pattern as an etching mask; and forming a source/drain region by ion-implanting a second conductive impurity into the semiconductor substrate.

Preferably, the mask pattern comprises one of SiON, $SiO_2$, and $Si_3N_4$.

To achieve another object oft he current invention, there is also provided a method for manufacturing a ferroelectric memory device, the method comprising the steps of: forming a device isolation region in a predetermined area of a semiconductor substrate of a first conductive type; sequentially depositing a yttrium oxide film, a ferroelectric film, a conductive film, and a mask layer; forming a mask pattern by patterning the mask layer; forming a gate comprising a gate electrode, a gate ferroelectric film, and a gate yttrium oxide film by etching the gate conductive film, the ferroelectric film, and the yttrium oxide film, using the mask pattern as an etching mask; ion-implanting a first impurity of a second conductive type different from the first conductive type and having a first concentration the semiconductor substrate; forming a spacer over the gate and covering sidewalls of the gate by depositing a material layer over the semiconductor substrate and dry-etching the material layer; and forming a source/drain region by again ion-implanting a second impurity of the second conductive type and having a second concentration into the semiconductor substrate, the second concentration being higher than the first concentration.

Preferably, the mask material layer comprises one of SiON, $SiO_2$, $Si_3N_4$, and $Y_2O_3$, and the spacer layer comprises the same material as that of the mask layer.

In the present invention, the yttrium oxide film is used as a buffer dielectric film between the silicon semiconductor substrate and the ferroelectric film. The present invention has an advantage in that it is easy to form the single crystals (heteroepitaxy) of the yttrium oxide film on the semiconductor substrate. Another advantage is that When a PZT or a PT ferroelectric film is formed on the yttrium oxide film, it is possible to form a ferroelectric film being an epitaxial layer well-arranged along a C-axis, thereby enhancing the polarization characteristics of the films. As a result, a good-quality ferroelectric film can be formed on a silicon semiconductor substrate.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention will be described in detail, referring to the attached drawings. First, the structure of a ferroelectric memory device according to the present invention will be described.

FIRST EMBODIMENT

Figure 1:
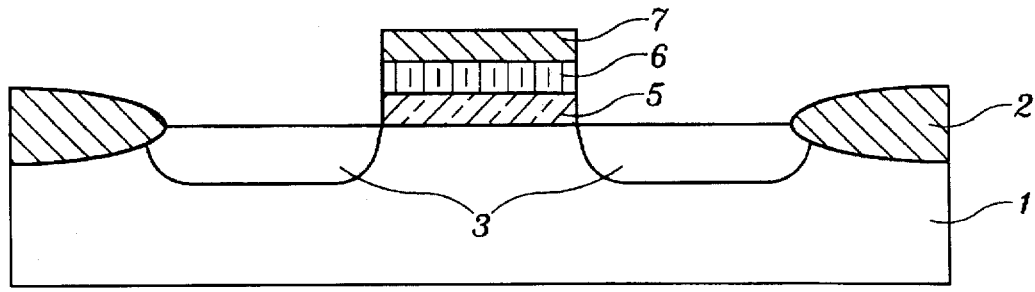
FIG. 1 is a sectional view of a conventional MFIS FET using a $CeO_2$ film.
Figure 2:
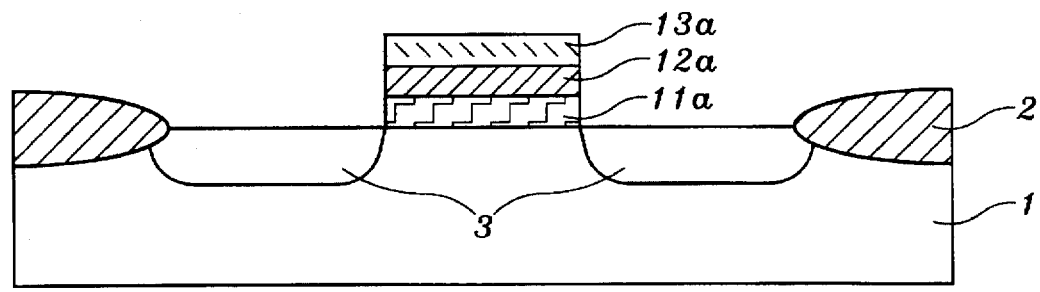
FIG. 2 is a sectional view of an MFIS FET according to a first preferred embodiment of the present invention.

FIG. 2 is a sectional view of an MFIS FET according to a first embodiment of the present invention. The first embodiment of the MFIS FET ferroelectric memory device comprises a p-type silicon substrate 1, a field oxide film 2 formed in a device isolation area of the p-type silicon substrate 1, an yttrium oxide ($Y_2O_3$) gate film 11a of a predetermined size formed on the surface of p-type silicon substrate 1, a ferroelectric gate film 12a formed over the yttrium oxide gate film 11a, a TiN gate electrode 13a formed over the ferroelectric gate film 12a, and an n-type source/drain region 3 formed in the p-type silicon substrate 1 at both sides of the TiN gate electrode 13a.

Figure 4A:
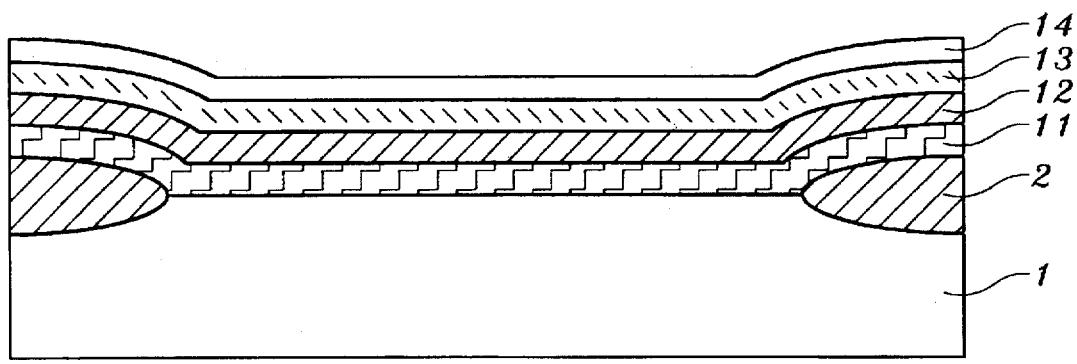
FIGS. 4A-4C are sectional views of sequential steps in a process for manufacturing the first preferred embodiment shown in FIG. 2.
Figure 4B:
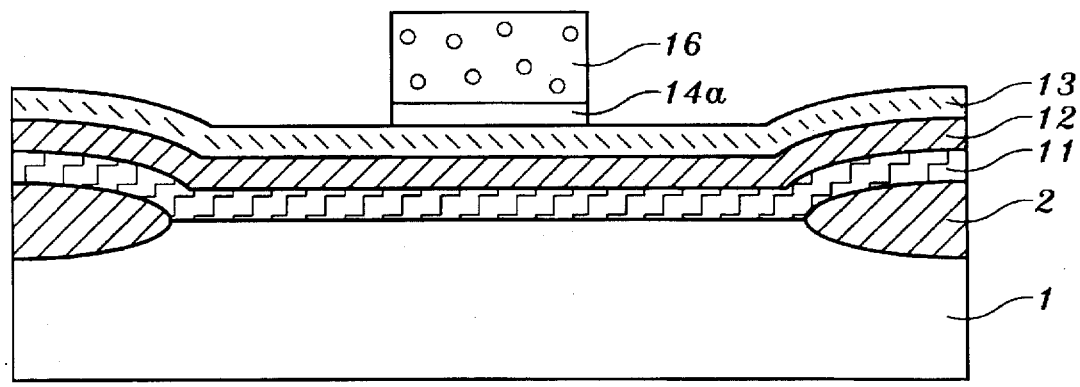
Figure 4C:
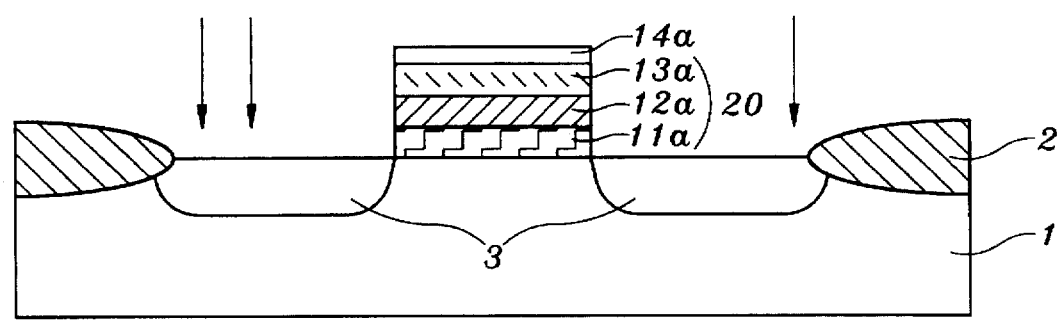

FIGS. 4A-4C are sectional views of sequential steps in a process for manufacturing the first preferred embodiment shown in FIG. 2; and FIG. 4A shows the step of sequentially depositing a yttrium oxide film 11, a ferroelectric film 12, a TiN film 13 and an SiON film 14 on the whole surface of p-type silicon substrate 1. Referring to FIG. 4A, field oxide film 2 is preferably formed on the p-type silicon substrate 1 by a general device isolation method such as a LOCOS, SEPOX or STI method. After the surface of p-type silicon substrate 1 is cleaned, the epitaxial layer of yttrium oxide film 11 is formed over the whole surface of p-type silicon substrate 1. The yttrium oxide film 11 is preferably formed by sputtering, reactive ionized cluster beam deposition, metal organic chemical vapor deposition, or any similar method. The ferroelectric film 12 is formed over the yttrium oxide film, and preferably comprises PZT, PT (PbTiO$_3$), or a material from the Y1 family of materials. The TiN film 13 is then formed over the ferroelectric film 12 and is used as a gate conductive film. In alternate embodiments, the TiN film 13 may be replaced with a double-layered film of TiN and tungsten. Following this, a mask film 14, preferably comprising SiON, is deposited to be used as a mask material layer. Although SiON is preferable for the mask film, any similar material such as SiO$_2$, Si$_3$N$_4$, or Y$_2$O$_3$ can be used, instead of SiON to form the mask film 14.

FIG. 4B shows the step of forming a mask pattern 14a by photolithography. Referring to FIG. 4B, a photoresist pattern 16 is formed on the mask film 14 by photolithography. The mask film 14 is then dry-etched by using photoresist pattern 16 as an etching mask, thereby forming a mask pattern 14a.

FIG. 4C shows the step of forming yttrium oxide gate film 11a, ferroelectric gate film 12a and TiN gate electrode 13a. Referring to 4C, photoresist pattern 16 is removed, and thereafter, the TiN film 13, the ferroelectric film 12 and the yttrium oxide film 11 are sequentially and anisotropically etched, using the mask pattern 14a as a mask. In this way the process forms a gate 20 comprising the yttrium oxide gate film 11a, the ferroelectric gate film 12a and the TiN gate electrode 13a. Thereafter an n-type impurity, e.g., arsenic, is ion-implanted into the whole surface of p-type silicon substrate 1, using the SiON film pattern 14a and the gate 20 as a mask. The ion-implanted n-type impurity is then activated to form the source/drain region 3. Afterwards, the mask pattern 14a is removed, and the MFIS FET shown in FIG. 2 is completed.

SECOND EMBODIMENT

Figure 3:
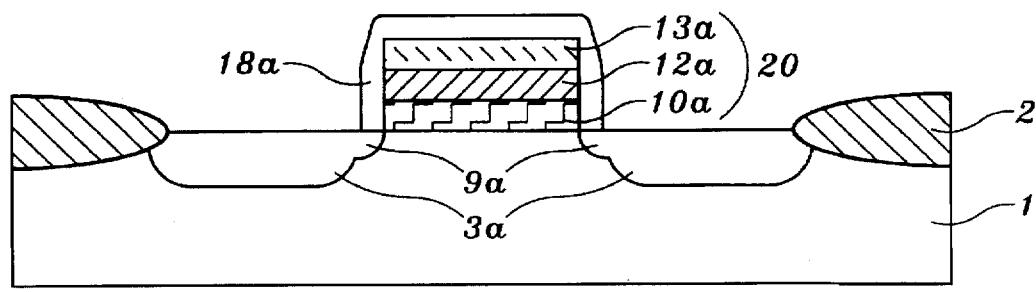
FIG. 3 is a sectional view of an MFIS FET of an LDD structure according to a second preferred embodiment of the present invention.

FIG. 3 is a cross-sectional view schematically showing an MFIS FET of a lightly-doped drain (LDD) structure according to a second embodiment of the present invention. The second embodiment of the MFIS FET ferroelectric memory device comprises a p-type silicon substrate 1, a field oxide film 2 formed in a device isolation area of the p-type silicon substrate 1, an yttrium oxide (Y$_2$O$_3$) film 11a of a predetermined size formed over the p-silicon substrate 1, a ferroelectric film 12a formed over the gate yttrium oxide film 11a, a TiN gate electrode 13a formed over the gate ferroelectric film 12a, a SiON spacer film 18a, a first concentration impurity region 9a, and a second concentration source/drain region 3a. The yttrium oxide film 11a, ferroelectric film 12a and TiN gate film 13a, together comprise a gate 20. The SiON spacer film 18a is formed on the entire surface of the gate 20. The first concentration impurity region 9a contains an n-type impurity and is formed below the SiON spacer film 18a in the p-type silicon substrate 1. The second concentration source/drain region 3a is formed in the p-type silicon substrate 1 at both sides of gate 20, and is connected to the first concentration impurity region 9a. The second concentration in the second concentration source drain region is preferably higher than the first concentration in the first concentration impurity region. As shown in FIG. 3, the device comprises an LDD structure including a first concentration impurity region 9a and second concentration source/drain region 3a, where the second concentration is higher than the first concentration.

FIGS. 5A–5E are sectional views of sequential steps in a process for manufacturing the second preferred embodiment shown in FIG. 3.

Figure 5A:
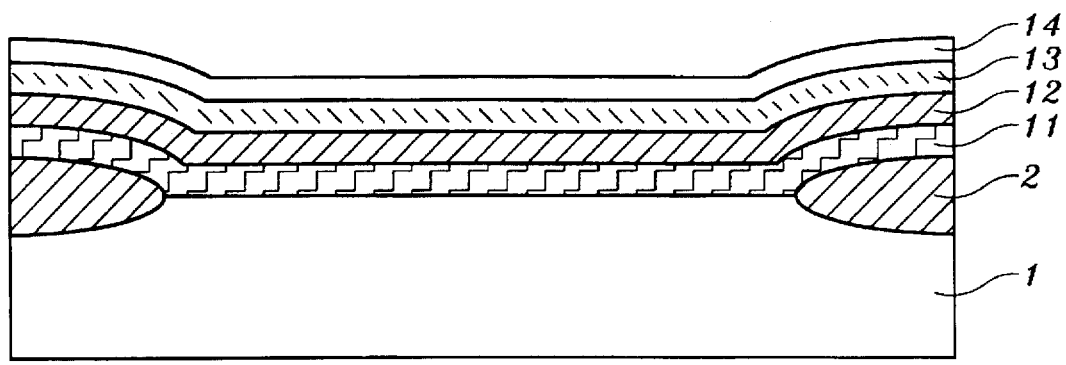
FIGS. 5A-5E are sectional views of sequential steps in a process for manufacturing the second preferred embodiment shown in FIG. 3.
Figure 5B:
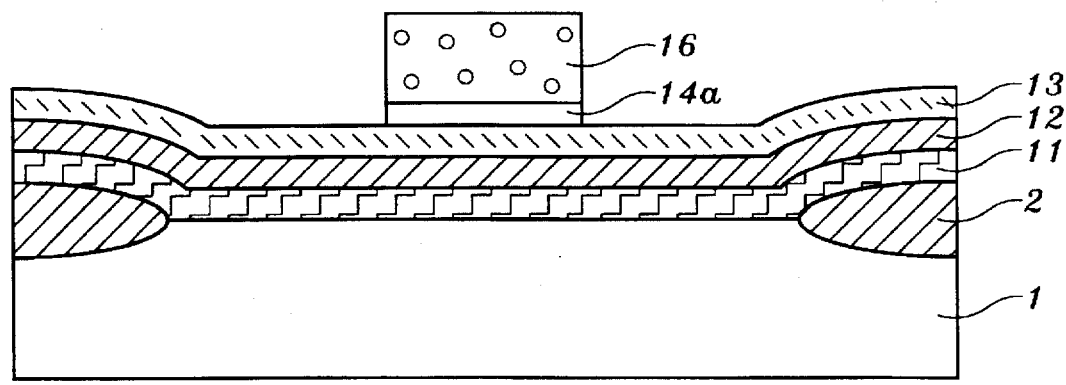

The steps shown in FIG. 5A and 5B are preferably performed in the same manner as those of FIGS. 4A and 4B, described above.

Figure 5C:
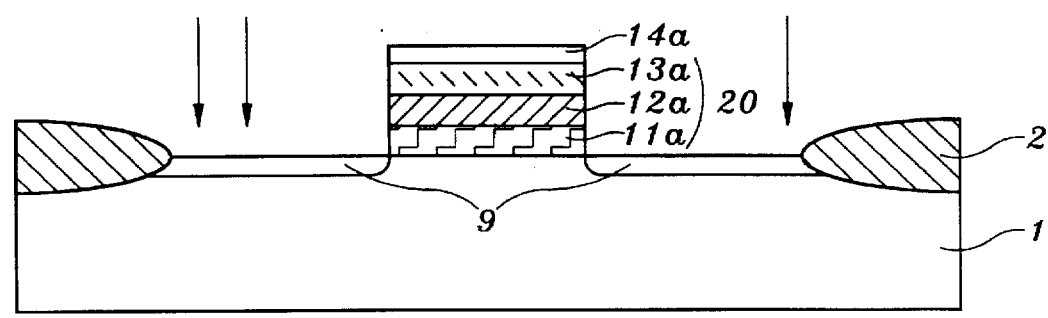

FIG. 5C shows the step of sequentially forming the yttrium oxide gate film 11a, the ferroelectric gate film 12a, and the TiN gate electrode 13a. Referring to FIG. 5C, the photoresist pattern 16 is removed and the TiN film 13, ferroelectric film 12 and yttrium oxide film 11 are sequentially and anisotropically etched, using the SiON film pattern 14a as a mask. This forms the gate 20 comprising the yttrium oxide gate film 11a, the ferroelectric gate film 12a, and the TiN gate electrode 13a. Thereafter, an n-type impurity, e.g., phosphorus, is ion-implanted into the whole surface of p-type silicon substrate 1 at a low concentration using the SiON film pattern 14a and the gate 20 as a mask, to form an impurity region 9.

Figure 5D:
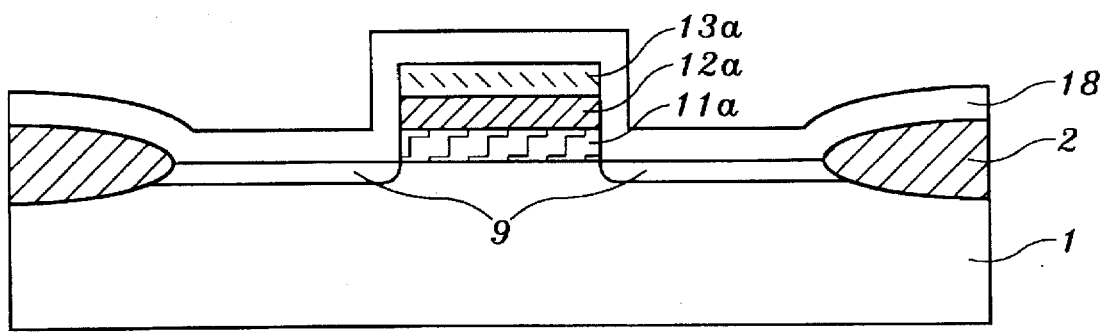

FIG. 5D shows the step of depositing a spacer layer 18 over the surface of the p-type silicon substrate 1. The spacer layer 18 preferably comprises SiON, although it may alternatively comprise SiO$_2$, Si$_3$N$_4$, or any similar material. The spacer layer 18 preferably comprises the same material as that of the mask film 14, so that the gate 20 is surrounded by only one material, and so that the spacer layer 18 can perform adequately as a gate insulating material in a subsequent process.

Figure 5E:
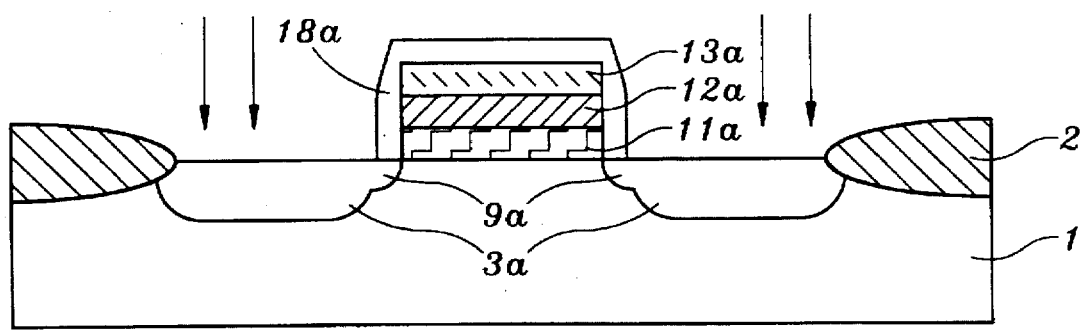

FIG. 5E shows the step of forming a spacer film 18a on each sidewall of gate 20. Referring to FIG. 5E, spacer film 18a is formed on the sidewalls of gate 20 by anisotropically etching the spacer layer 18. An n-type impurity, e.g., arsenic, is then ion-implanted into the whole surface at a high concentration using the gate 20 and the spacer film 18a as a mask. The ion-implanted impurity is then activated to form a first concentration impurity region 9a and a second impurity source/drain region 3a, and the LDD MFIS FET shown in FIG. 3 is completed.

As described above, the yttrium oxide film is used as a buffer dielectric film between the silicon semiconductor substrate and the ferroelectric film. The present invention has an advantage in that it is easy to form the single crystals (heteroepitaxy) of the yttrium oxide film on the semiconductor substrate. Another advantage is that when a PZT or a PT ferroelectric film is formed on the yttrium oxide film, a ferroelectric film being an epitaxial layer well-arranged along a C-axis, can be formed, thereby the polarization characteristics of the films. Therefore, a good-quality ferroelectric film can be formed on a silicon semiconductor substrate.

Further, excellent current-voltage and capacitance-voltage characteristics are obtained when the yttrium oxide film is used as an insulating film. A memory device using a yttrium oxide film, therefore, exhibits excellent electrical characteristics.

Though the present invention has been specifically described with the above embodiments, it is not restricted to these embodiments. Various changes and modifications may be effected by one having an ordinary skill in the art and remain within the scope of the invention, as defined by the appended claims. For example, a p-type MFIS FET can be manufactured using an n-type silicon substrate, in accordance with either of the above embodiments.

What is claimed is:

1. A method for manufacturing a ferroelectric memory device, comprising the steps of:

forming a device isolation region in a area of a semiconductor substrate of a first conductivity type;

sequentially depositing a yttrium oxide film, a ferroelectric film, and a conductive film over the surface of the semiconductor substrate;

forming a mask pattern over the yttrium oxide film, ferroelectric film, and gate conductive film;

forming a gate electrode, a ferroelectric gate film and a yttrium oxide gate film by etching the conductive film, the ferroelectric film and the yttrium oxide film, using the mask pattern as an etching mask; and forming a source/drain region by ion-implanting a second conductivity impurity into the semiconductor substrate.

2. A method for manufacturing a ferroelectric memory device as claimed in claim 1, wherein the mask pattern comprises a material selected from the group consisting of SiON, $SiO_2$ and $Si_3N_4$.

3. A method for manufacturing a ferroelectric memory device, comprising the steps of:

forming a device isolation region in a area of a semiconductor substrate of a first conductivity type;

sequentially depositing a yttrium oxide film, a ferroelectric film, a conductive film, and a mask layer;

forming a mask pattern by patterning the mask layer;

forming a gate comprising a gate electrode, a gate ferroelectric film, and a gate yttrium oxide film by etching the gate conductive film, the ferroelectric film, and the yttrium oxide film, using the mask pattern as an etching mask;

ion-implanting a first impurity of a second conductivity type different from the first conductivity type and having a first concentration into the semiconductor substrate;

forming a spacer over the gate and covering sidewalls of the gate by depositing a material layer over the semiconductor substrate and dry-etching the material layer; and forming a source/drain region by again ion-implanting a second impurity of the second conductivity type and having a second concentration into the semiconductor substrate, the second concentration being higher than the first concentration.

4. A method for manufacturing a ferroelectric memory device as claimed in claim 3, wherein the mask layer comprises a material selected from the group consisting of SiON, $SiO_2$, $Y_2O_3$, and $Si_3N_4$.

5. A method for manufacturing a ferroelectric memory device as claimed in claim 3, wherein the spacer layer comprises the same material as the mask layer.

* * * * *